(12) United States Patent
Pengelly

(10) Patent No.: US 9,564,864 B2
(45) Date of Patent: *Feb. 7, 2017

(54) ENHANCED DOHERTY AMPLIFIER

(71) Applicant: Cree, Inc., Durham, NC (US)

(72) Inventor: Raymond Sydney Pengelly, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/268,007

(22) Filed: May 2, 2014

(65) Prior Publication Data

US 2014/0240039 A1  Aug. 28, 2014

Related U.S. Application Data

(63) Continuation of application No. 13/049,312, filed on Mar. 16, 2011, now Pat. No. 8,749,306.

(51) Int. Cl.
*H03F 3/68* (2006.01)
*H03F 3/20* (2006.01)
(Continued)

(52) U.S. Cl.
CPC ............. *H03F 3/68* (2013.01); *H03F 1/0288* (2013.01); *H03F 1/42* (2013.01); *H03F 3/189* (2013.01);
(Continued)

(58) Field of Classification Search
USPC .................. 330/295, 124 R, 84, 286, 53–54
See application file for complete search history.

(56) References Cited

U.S. PATENT DOCUMENTS 6,329,877 B1   12/2001   Bowen et al.
7,078,976 B2   7/2006    Blednov
(Continued)

FOREIGN PATENT DOCUMENTS

WO   2004017512 A1   2/2004
WO   2007119208 A2   10/2007
(Continued)

OTHER PUBLICATIONS

Choi, J. et al., "Optimized envelope tracking operation of Doherty power amplifier for high efficiency over an extended dynamic range," IEEE Transactions on Microwave Theory and Techniques, vol. 57, No. 6, Jun. 2009, pp. 1508-1515.
(Continued)

*Primary Examiner* — Hieu Nguyen
(74) *Attorney, Agent, or Firm* — Anthony J. Josephson

(57) ABSTRACT

The disclosure relates to an enhanced Doherty amplifier that provides significant performance improvements over conventional Doherty amplifiers. The enhanced Doherty amplifier includes a power splitter, combining node, a carrier path, and a peaking path. The power splitter is configured to receive an input signal and split the input signal into a carrier signal provided at a carrier splitter output and a peaking signal provided at a peaking splitter output. The carrier path includes carrier power amplifier circuitry, a carrier input network coupled between the carrier splitter output and the carrier power amplifier circuitry, and a carrier output network coupled between the carrier power amplifier circuitry and the Doherty combining node. The peaking path includes peaking power amplifier circuitry, a peaking input network coupled between the peaking splitter output and the peaking power amplifier circuitry, and a carrier output network coupled between the power amplifier circuitry and the Doherty combining node.

30 Claims, 8 Drawing Sheets

(51) Int. Cl.
  H03F 3/189   (2006.01)
  H03F 1/02    (2006.01)
  H03F 1/42    (2006.01)
  H03F 3/21    (2006.01)
(52) U.S. Cl.
  CPC .............. *H03F 3/20* (2013.01); *H03F 3/211* (2013.01); *H03F 2200/111* (2013.01); *H03F 2200/36* (2013.01); *H03F 2200/39* (2013.01); *H03F 2200/429* (2013.01); *H03F 2200/451* (2013.01); *H03F 2203/20* (2013.01)

(56) References Cited

U.S. PATENT DOCUMENTS

| | | | |
|---|---|---|---|
| 7,193,472 B2* | 3/2007 | Gotou et al. | 330/295 |
| 7,342,444 B2 | 3/2008 | Kim et al. | |
| 7,656,228 B2* | 2/2010 | Fukuda et al. | 330/126 |
| 8,005,445 B2 | 8/2011 | Kuriyama et al. | |
| 8,154,339 B2* | 4/2012 | Zolghadri et al. | 330/124 R |
| 8,305,141 B2* | 11/2012 | Jeong et al. | 330/295 |
| 8,339,196 B2* | 12/2012 | Hong et al. | 330/124 R |
| 8,477,832 B2 | 7/2013 | Sawatzy | |
| 8,749,306 B2 | 6/2014 | Pengelly | |
| 2004/0041627 A1 | 3/2004 | Kim et al. | |
| 2004/0113698 A1 | 6/2004 | Kim et al. | |
| 2006/0097783 A1 | 5/2006 | Okubo et al. | |
| 2006/0145757 A1 | 7/2006 | Kim et al. | |
| 2008/0068078 A1 | 3/2008 | Iwasaki | |
| 2008/0125061 A1 | 5/2008 | Kuriyama et al. | |
| 2008/0191801 A1 | 8/2008 | Kim et al. | |
| 2010/0148877 A1 | 6/2010 | Oakley et al. | |
| 2012/0235734 A1 | 9/2012 | Pengelly | |

FOREIGN PATENT DOCUMENTS

| | | |
|---|---|---|
| WO | 2007122586 A2 | 11/2007 |
| WO | 2008053534 A1 | 5/2008 |
| WO | 2010003865 A1 | 1/2010 |
| WO | 2012125279 A2 | 9/2012 |
| WO | 2012125279 A3 | 9/2012 |

OTHER PUBLICATIONS

Gajadharsing, J. R. et al., "Analysis and design of a 200W LDMOS based Doherty amplifier for 3G base stations," 2004 IEEE Microwave Symposium Digest, vol. 2, Jun. 6, 2004, pp. 529-532.
Kim, J. et al., "Analysis of a fully matched saturated Doherty amplifier with excellent efficiency," IEEE Transactions on Microwave Theory and Techniques, vol. 56, No. 2, Feb. 2008, pp. 328-338.
Non-Final Office Action for U.S. Appl. No. 13/049,312, mailed Jun. 1, 2012, 14 pages.
Final Office Action for U.S. Appl. No. 13/049,312, mailed Sep. 17, 2012, 15 pages.
Non-Final Office Action for U.S. Appl. No. 13/049,312, mailed Nov. 27, 2012, 5 pages.
Final Office Action for U.S. Appl. No. 13/049,312, mailed May 31, 2013, 6 pages.
Advisory Action for U.S. Appl. No. 13/049,312, mailed Aug. 6, 2013, 3 pages.
Final Office Action for U.S. Appl. 13/049,312, mailed Nov. 22, 2013, 7 pages.
Notice of Allowance for U.S. Appl. No. 13/049,312, mailed Jan. 28, 2014, 8 pages.
Examination Report for European Patent Application No. 12716118.0, issued Jul. 7, 2014, 5 pages.
Invitation to Pay Additional Fees and, Where Applicable, Protest Fee for PCT/US2012/026850, mailed Jun. 22, 2012, 8 pages.
International Search Report and Written Opinion for PCT/US2012/026850, mailed Nov. 16, 2012, 26 pages.
International Preliminary Report on Patentability and Written Opinion for PCT/US2012/026850, mailed Sep. 26, 2013, 15 pages.
Examination Report for European Patent Application No. 12 716 118.0, issued Dec. 1, 2014, 5 pages.
Notice of Reason for Rejection for Japanese Patent Application No. 2013-558027, issued May 29, 2015, 10 pages.
Examination Report for European Patent Application No. 12 716 118.0, issued Apr. 21, 2015, 5 pages.
First Office Action and Search Report for Chinese Patent Application No. 201280013508.4, mailed Sep. 6, 2015, 18 pages.
Second Office Action for Chinese Patent Application No. 201280013508.4, issued May 13, 2016, 8 pages.
Examination Report for European Patent Application No. 12716118.0, mailed Mar. 29, 2016, 2 pages.
Notice of Reason for Rejection for Japanese Patent Application No. 2013-558027, mailed Mar. 25, 2016, 12 pages.

* cited by examiner (DOHERTY PA)

(DOHERTY PA)

(TYPICAL PA)

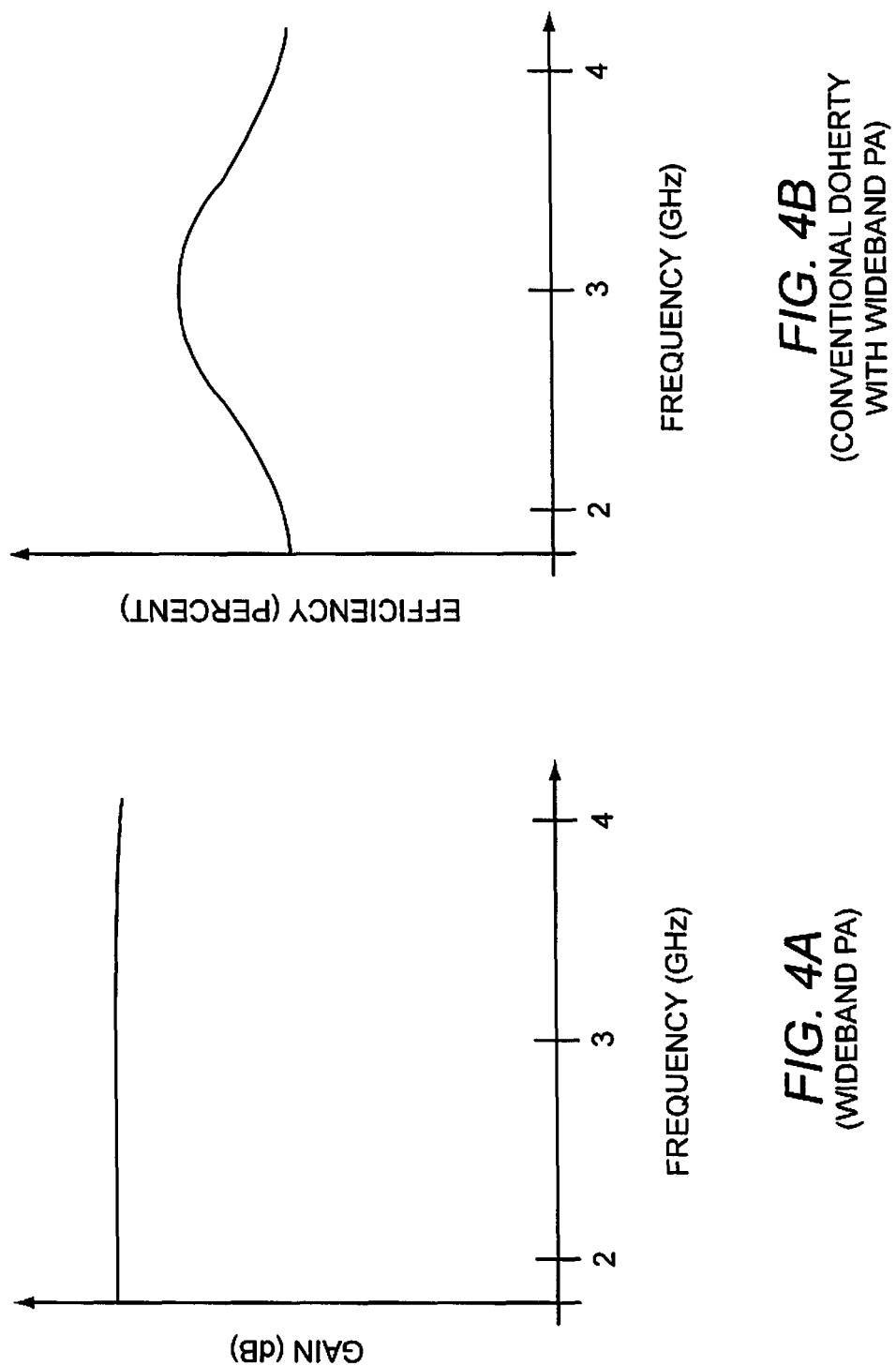
FIG. 4A (WIDEBAND PA)
FIG. 4B (CONVENTIONAL DOHERTY WITH WIDEBAND PA)

ENHANCED DOHERTY AMPLIFIER

CROSS REFERENCE TO RELATED APPLICATION

The present application is a continuation of U.S. patent application Ser. No. 13/049,312, which was filed on Mar. 16, 2011, the disclosure of which is incorporated herein by reference in its entirety

FIELD OF THE DISCLOSURE

The present disclosure relates to power amplifiers and in particular to Doherty amplifiers that are capable of operating efficiently over wider bandwidths than conventional Doherty amplifiers.

BACKGROUND

As current mobile communication systems evolve and new communications systems are developed, there is continuing demand for more powerful and efficient power amplifiers that are capable of operating over broader frequency ranges. Many of these communication systems employ mobile devices and access points, such as base stations, that are battery powered. For such communication devices, more efficient power amplifiers yield longer operating times between battery charges.

Further, the transmit power levels for mobile devices and especially access points are continuing to increase at the same time that sizes of these devices are shrinking. As the power levels increase, the amount of heat that is generated during amplification generally increases. Therefore, designers are faced with dissipating greater quantities of heat from shrinking communication devices or reducing the amount of heat generated by the power amplifiers therein. More efficient power amplifiers are preferred because they generate less heat than less efficient power amplifiers at corresponding power levels, and thus reduce the amount of heat to dissipate during operation.

Given the ever increasing demand for efficiency, the Doherty amplifier has become a popular power amplifier in mobile communication applications, especially base station applications. While relatively efficient compared to its rivals, the Doherty amplifier has a relatively limited bandwidth of operation. For example, a well-designed Doherty amplifier may provide an instantaneous bandwidth of 5 percent, which corresponds to about 100 MHz for a 2 GHz signal and is generally sufficient to support a single communication band. For example, Universal Mobile Telecommunications Systems (UMTS) devices operate in a band between 2.11 and 2.17 GHz, and thus require an instantaneous bandwidth of 60 MHz (2.17 GHz-2.11 GHz). A Doherty amplifier can be configured to support an instantaneous bandwidth of 60 MHz for the UMTS band. Accordingly, for communication devices that only need to support a single communication band, the limited operating bandwidth of the Doherty power amplifier poses no problems.

However, modern communication devices are often required to support various communication standards that employ different modulation techniques over a wide range of operating frequencies. These standards include but are not limited to the Global System for Mobile Communications (GSM), Personal Communication Service (PCS), Universal Mobile Telecommunications Systems (UMTS), Worldwide Interoperability for Microwave Access (WiMAX), Long Term Evolution (LTE), and the like.

The bands of operation for these standards range from around 800 MHz to 4 GHz for consumer telecommunication applications and from 20 MHz to 6 GHz for military applications. The GSM standards alone employ bands ranging from around 800 MHz to 2 GHz. For example, GSM-850 uses an 824-894 MHz band, GSM-900 uses an 890-960 MHz band, GSM-1800 uses a 1710-1880 MHz band, and GSM-1900 uses an 1850-1990 MHz band. UMTS uses a 2.11-2.17 GHz band. LTE uses a 2.6-2.7 GHz band, and WiMAX uses bands centered about 2.3, 2.5, 3.3 and 3.5 GHz. Thus, for devices that need to support multiple communication bands, a single Doherty amplifier is not sufficient.

For communication devices that support multiple standards over disparate communication bands, designers often employ multiple power amplifier chains for each of the different communication bands, which increases the size, cost, and complexity of the communication devices. As such, there is a need to increase the effective operating range of a Doherty power amplifier to support multiple communication bands, which are spread over a significant frequency range, while maintaining the efficiency afforded by current Doherty power amplifier designs.

SUMMARY

The present disclosure relates to an enhanced Doherty amplifier that provides significant performance improvements over conventional Doherty amplifiers. The enhanced Doherty amplifier includes a power splitter, a combining node, a carrier path, and a peaking path. The power splitter is configured to receive an input signal and split the input signal into a carrier signal provided at a carrier splitter output and a peaking signal provided at a peaking splitter output. The carrier path includes carrier power amplifier circuitry, a carrier input network coupled between the carrier splitter output and the carrier power amplifier circuitry, and a carrier output network coupled between the carrier power amplifier circuitry and the Doherty combining node. The peaking path includes peaking power amplifier circuitry, a peaking input network coupled between the peaking splitter output and the peaking power amplifier circuitry, and a carrier output network coupled between the power amplifier circuitry and the Doherty combining node.

In one embodiment, the carrier and peaking input networks are configured to impose phase shifts causing the peaking signal to lag the carrier signal by approximately 90 degrees when the carrier and peaking signals are respectively presented to the carrier and peaking power amplifier circuitries. The carrier and peaking output networks are configured to impose further phase shifts causing the peaking and carrier signals to arrive at the Doherty combining node for reactive combining to generate an output signal. The carrier input and output networks and the peaking input and output networks may include lumped elements and need not include transmission lines. As such, these networks may be synthesized as a group to provide improved performance characteristics for the overall enhanced Doherty amplifier.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 4A is a plot of gain versus frequency for a wideband (non-Doherty) power amplifier.

FIG. 4B is a plot of gain versus frequency for a conventional Doherty amplifier employing wideband amplifiers.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
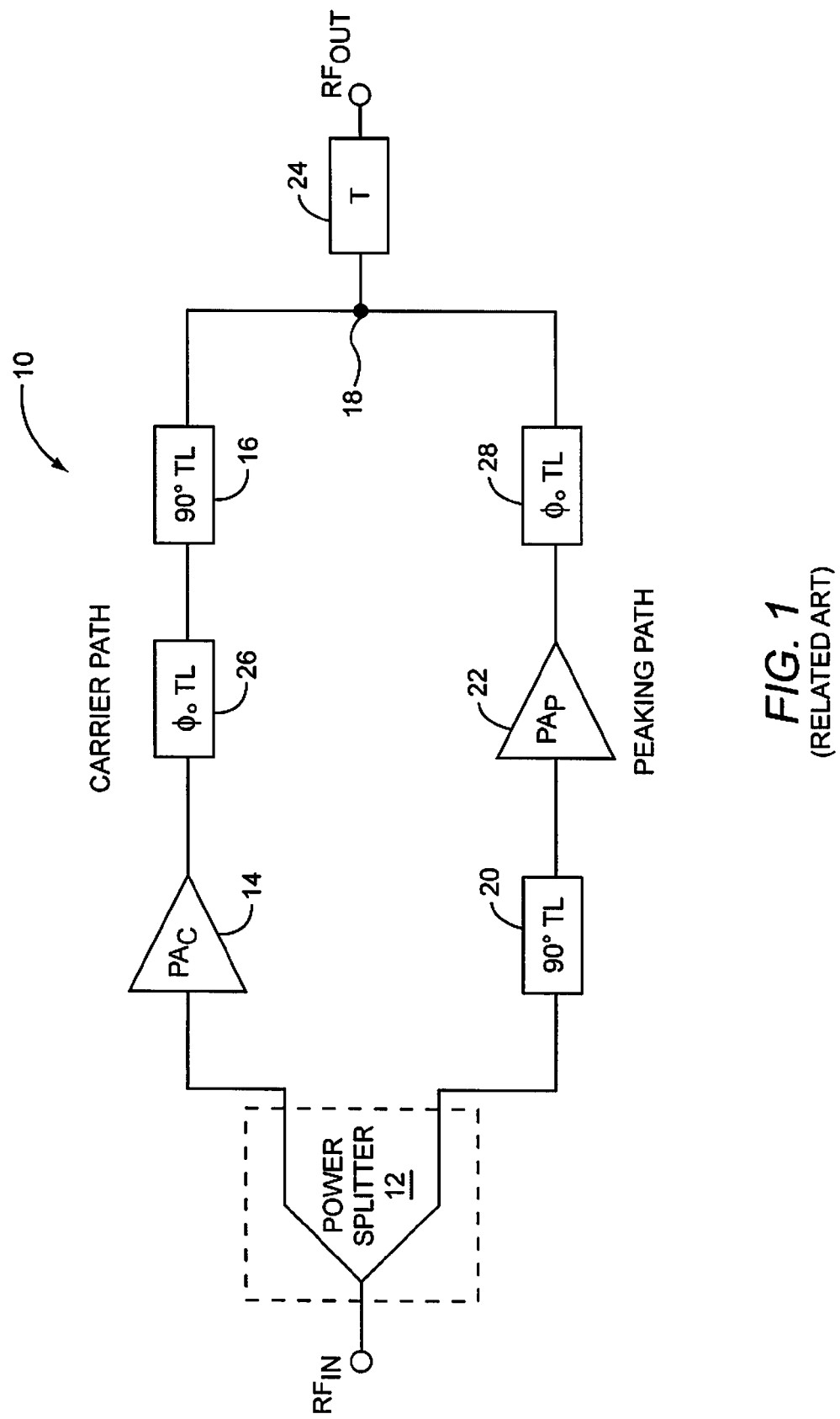
FIG. 1 is schematic diagram of a conventional Doherty amplifier.

The present disclosure relates to increasing the bandwidth of operation of a Doherty power amplifier. Prior to delving into the details of how a Doherty power amplifier can be modified to increase its bandwidth of operation, an overview of a traditional Doherty power amplifier 10 is provided in association with FIG. 1. As illustrated, a modulated RF input signal $RF_{IN}$ is fed to a power splitter 12, such as a Wilkinson splitter, which splits the RF input signal $RF_{IN}$ along a "carrier path" and a "peaking path." Traditionally, the RF input signal $RF_{IN}$ is split evenly such that the carrier path and the peaking path receive one half (−3 dB) of the original input power of the RF input signal $RF_{IN}$.

The carrier path generally includes carrier power amplifier circuitry ($PA_C$) 14 followed by a first transmission line (TL) 16 that is sized to provide a 90° phase shift at or near the center frequency of the operating bandwidth. The carrier path terminates at a Doherty combining node 18, which is further coupled to a transformer 24, which is ultimately coupled to an antenna (not shown). The peaking path includes a second transmission line (TL) 20 that is sized to provide a 90° phase shift at or near the center frequency of the operating bandwidth followed by peaking power amplifier circuitry ($PA_P$) 22. As such, the RF input signal $RF_{IN}$ provided along both the carrier path and the peaking path are 90° out of phase with one another when they are amplified by the respective carrier and peaking power amplifier circuitries 14 and 22. As with the carrier path, the peaking path terminates into the Doherty combining node 18. Notably, the power splitter 12 may inherently provide a 90° phase shift in the leg feeding the peaking path. In such cases, the second transmission line 20 is not included.

In traditional Doherty fashion, the carrier power amplifier circuitry 14 provides a class A/B (or B) amplifier, and the peaking power amplifier circuitry 22 provides a class C amplifier. During operation, the RF input signal $RF_{IN}$ is split and directed along the carrier and peaking paths to the respective carrier and peaking power amplifier circuitries 14 and 22. Notably, the second transmission line 20 delays the portion of the RF input signal $RF_{IN}$ in the peaking path by 90° prior to reaching the peaking power amplifier circuitry 22.

A Doherty amplifier is generally considered to have two regions of operation. In the first region, only the carrier power amplifier circuitry 14 is turned on and operates to amplify the RF input signal $RF_{IN}$. In the second region, both the carrier power amplifier circuitry 14 and the peaking power amplifier circuitry 22 operate to amplify the RF input signal $RF_{IN}$ in the respective carrier and peaking paths. The threshold between the two regions corresponds to a magnitude of RF input signal $RF_{IN}$ in the carrier path where carrier power amplifier circuitry 14 becomes saturated. In the first region, the levels of the RF input signal $RF_{IN}$ are below the threshold. In the second region, the levels of RF input signal $RF_{IN}$ are at or above the threshold In the first region where the level of the RF input signal $RF_{IN}$ is below the given threshold, the carrier power amplifier circuitry 14 amplifies the portion of the RF input signal $RF_{IN}$ in the carrier path. When the RF input signal $RF_{IN}$ is below the given threshold, the peaking power amplifier circuitry 22 is turned off and consumes little power. As such, only the carrier power amplifier circuitry 14 supplies an amplified RF input signal $RF_{IN}$ to the Doherty combining node 18 and transformer 24 to provide an RF output signal $RF_{OUT}$. The overall efficiency of the Doherty amplifier is determined predominantly by the efficiency of the class AB (or B) amplifier of the carrier power amplifier circuitry 14.

In the second region where the RF input signal $RF_{IN}$ is at or above the given threshold, the carrier power amplifier circuitry 14 is saturated and delivers its maximum power to the Doherty combining node 18 via the first transmission line 16. Further, as the RF input signal $RF_{IN}$ rises above the given threshold, the peaking power amplifier circuitry 22 turns on and begins amplifying the portion of the RF input signal $RF_{IN}$ that flows along the peaking path. As the RF input signal $RF_{IN}$ continues to rise above the given threshold, the peaking power amplifier circuitry 22 delivers more power to the Doherty combining node 18 until the peaking power amplifier circuitry 22 becomes saturated.

In the second region, both the carrier and peaking power amplifier circuitries 14 and 22 are delivering amplified signals to the Doherty combining node 18. By employing the first and second transmission lines 16 and 20 in the carrier and peaking paths, the amplified signals in each path reach the Doherty combining node in phase and are reactively combined. The combined signal is then stepped up or down via the transformer 24 to generate the amplified RF output signal $RF_{OUT}$.

Figure 2:
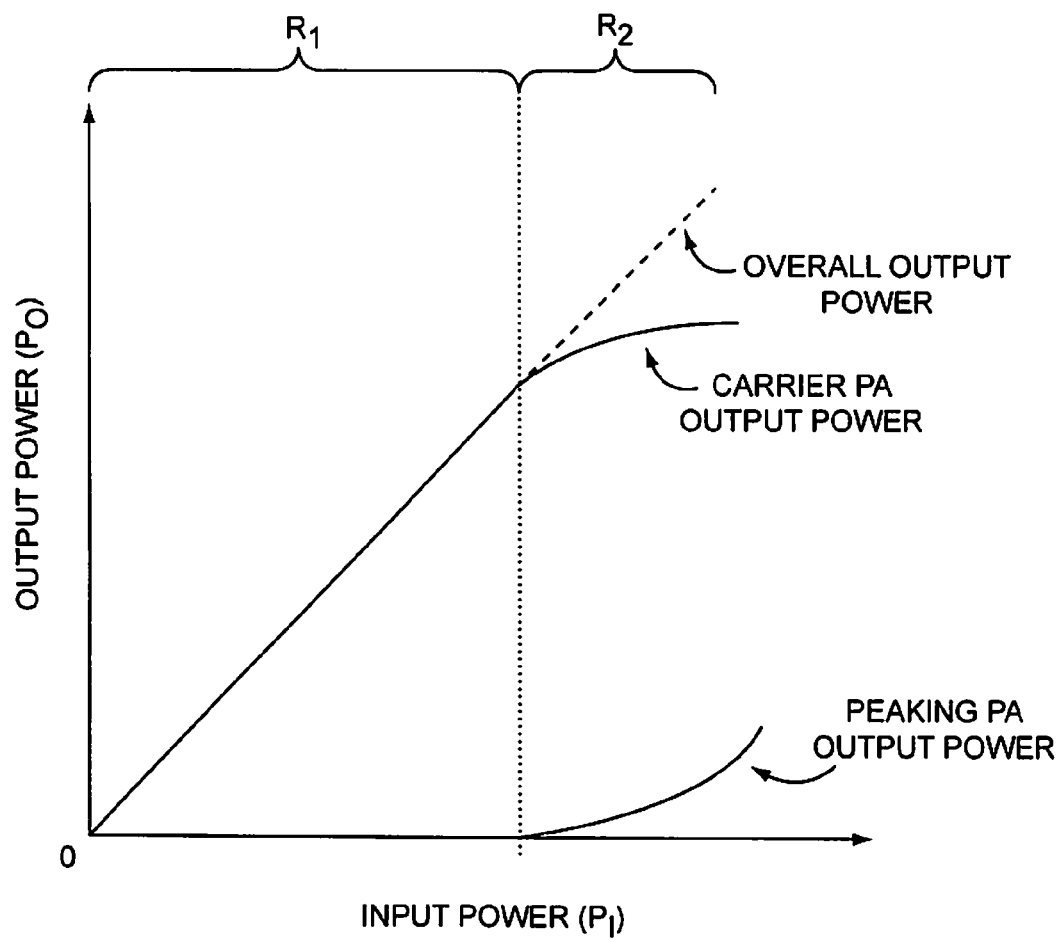
FIG. 2 is a plot of input power versus output power for the carrier and peaking amplifier circuitries of the conventional Doherty amplifier.

The graph of FIG. 2 plots output power ($P_O$) versus input power ($P_I$) for the carrier power amplifier circuitry 14, the peaking power amplifier circuitry 22, and the overall Doherty amplifier 10. As illustrated, the carrier power amplifier circuitry 14 operates linearly throughout first region R1 until becoming saturated. Once the carrier power amplifier circuitry 14 reaches saturation, the second region R2 is entered. In the second region R2, the peaking power amplifier circuitry 22 turns on and begins to amplify the RF input signal $RF_{IN}$. The overall output power for the Doherty amplifier is effectively the sum of the output power of the carrier and peaking power amplifiers 14 and 22 in the second region R2.

When operating in the second region R2, the power supplied by the peaking power amplifier circuitry 22 effectively reduces the apparent load impedance presented to the carrier power amplifier circuitry 14. Reducing the apparent load impedance allows the carrier power amplifier circuitry 14 to deliver more power to the load while remaining saturated. As a result, the maximum efficiency of the carrier power amplifier circuitry 14 is maintained and the overall efficiency of the Doherty amplifier 10 remains high throughout the second region R2 until the peaking power amplifier circuitry 22 becomes saturated.

Figure 3B:
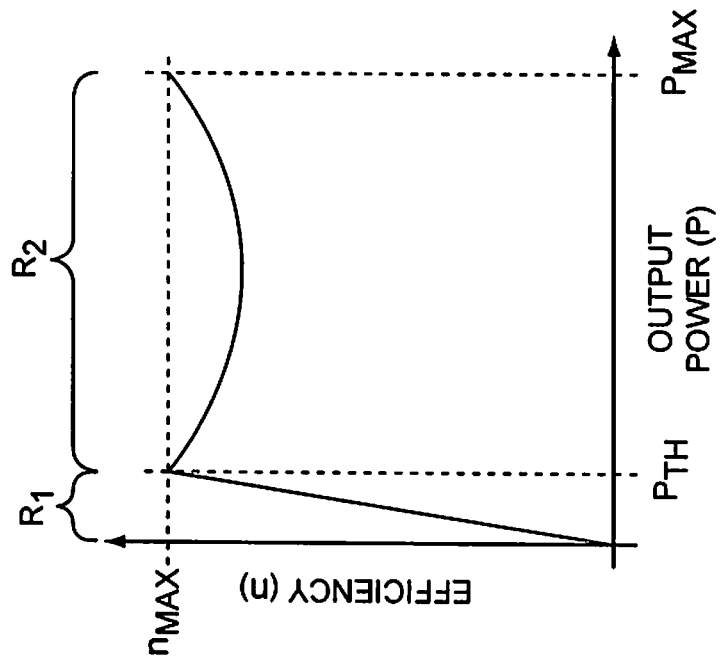
FIG. 3B is a plot of efficiency versus output power for a conventional Doherty amplifier.
Figure 3A:
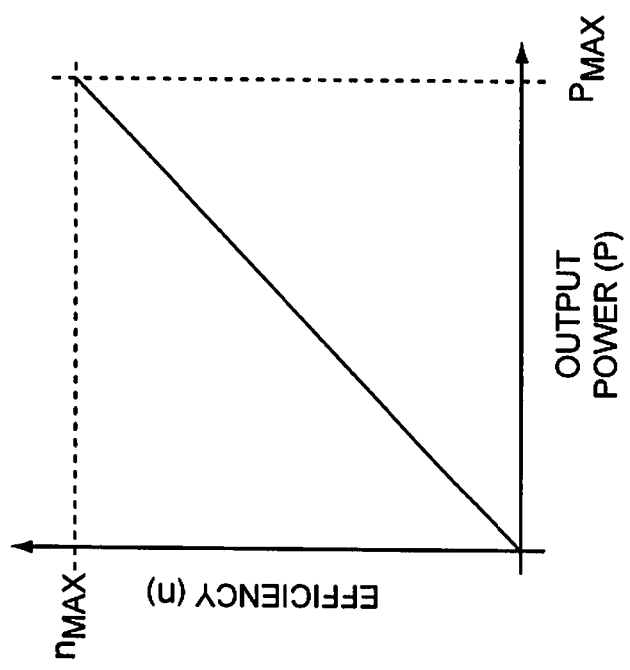
FIG. 3A is a plot of efficiency versus output power for a typical (non-Doherty) power amplifier.

The graphs of FIGS. 3A and 3B plot efficiency versus output power for a typical power amplifier and a typical Doherty amplifier, respectively. With reference to FIG. 3A, the efficiency η of the typical power amplifier increases proportionally to the output power P until the power amplifier saturates and reaches its maximum output power $P_{MAX}$. As illustrated in FIG. 3B, the carrier power amplifier circuitry 14 of the Doherty amplifier 10 operates in a similar fashion. Progressing through first region R1, the peaking power amplifier circuitry 22 remains off and the RF input signal $RF_{IN}$ increases to a point where the carrier power amplifier circuitry 14 becomes saturated. Throughout the first region R1, the efficiency of the carrier power amplifier circuitry 14, and thus the overall efficiency η for the Doherty amplifier 10, increases proportionally with the output power P until the carrier power amplifier circuitry 14 becomes saturated at a given output power level. This given output power level is referred to herein as a threshold power level $P_{TH}$, and is shown, for illustrative purposes only, at one-ninth (⅑) of the maximum output power $P_{MAX}$ (⅑ $P_{MAX}$) of the Doherty amplifier 10.

As the RF input signal $RF_{IN}$ increases past the point where the carrier power amplifier circuitry 14 becomes saturated, the Doherty amplifier enters the second region R2. As the second region R2 is entered, the peaking power amplifier circuitry 22 begins to amplify the RF input signal $RF_{IN}$. The carrier power amplifier circuitry 14 remains saturated and continues to amplify the RF input signal $RF_{IN}$. As the RF input signal $RF_{IN}$ increases further, the peaking power amplifier circuitry 22 delivers more power until the peaking power amplifier circuitry 22 becomes saturated at the maximum output power $P_{max}$ of the Doherty amplifier 10. Throughout the second region R2, the overall efficiency η for the Doherty amplifier 10 remains high and peaks at the beginning of the second region R2 where the carrier power amplifier circuitry 14 first becomes saturated and at the end of the second region R2 where the peaking power amplifier circuitry 22 becomes saturated. As clearly depicted in FIGS. 3A and 3B, the power added efficiency at backed off power levels from around the threshold power level $P_{TH}$ up to the maximum output power $P_{MAX}$ is significantly improved in the Doherty amplifier 10 over that of a typical power amplifier.

Returning to FIG. 1, the illustrated Doherty amplifier 10 is shown to have a third transmission line 26 in the carrier path and a fourth transmission line 28 in the peaking path. The third and fourth transmission lines 26 and 28 may be used to provide phase offsets in the outputs of the carrier and peaker paths in an effort to have the changing output impedance of the peaking power amplifier circuitry 22 properly load the output impedance of the carrier power amplifier circuitry 14 and vice versa.

As shown above, a conventional Doherty amplifier 10 is very efficient at both heavily backed off and maximum power levels. Unfortunately, the conventional Doherty amplifier 10 is relatively bandwidth limited and only provides an available instantaneous bandwidth of 5% of the operating frequency. For example, a Doherty amplifier 10 designed to transmit signals centered around 2.1 GHz will have at most an available bandwidth of approximately 105 MHz.

Notably, the carrier and peaking power amplifier circuitries 14 and 22 do not limit the bandwidth of the conventional Doherty amplifier 10. Even if these carrier and peaking power amplifier circuitries 14 and 22 were designed to be wideband amplifiers and individually support bandwidths of several octaves, the overall instantaneous bandwidth of the conventional Doherty amplifier 10 would remain limited to around 5% of the operating frequency. For example, if each of the carrier and peaking power amplifier circuitries 14 and 22 were individually designed to have available bandwidths between 2 GHz to 4 GHz, the overall instantaneous bandwidth of the Doherty amplifier 10 would remain limited to around 5% of the operating frequency (100 MHz at 2 GHz; 400 MHz at 6 Hz). Thus, no matter how wide the operating range of the carrier and peaking power amplifier circuitries 14 and 22 that you employ in the conventional Doherty amplifier 10, other components of the conventional Doherty amplifier 10 limit the available bandwidth.

FIGS. 4A and 4B illustrate the above concept. FIG. 4A plots gain versus frequency for a wideband power amplifier, and FIG. 4B plots gain versus frequency for the conventional Doherty amplifier 10 where the same wideband power amplifier is used for both the carrier and peaking power amplifier circuitries 14 and 22. As depicted, the conventional Doherty amplifier 10 has a much more limited bandwidth than that of the stand-alone wideband power amplifier, even when it employs wideband amplifiers in the carrier and peaking power amplifier circuitries 14 and 22. Thus, simply using a wideband power amplifier in the conventional Doherty amplifier 10 will not necessarily increase the bandwidth of the Doherty amplifier 10.

It has been discovered that the primary bandwidth limiting components of the conventional Doherty amplifier 10 are the power splitter 12, the first and second transmission lines 16, 20 that provide the 90° phase shifts, the third and fourth transmission lines 26, 28 that provide the phase offsets, and the transformer 24. The present disclosure provides techniques for replacing or modifying various components of the conventional Doherty amplifier 10 to significantly increase the overall bandwidth of the conventional Doherty amplifier 10.

Figure 5:
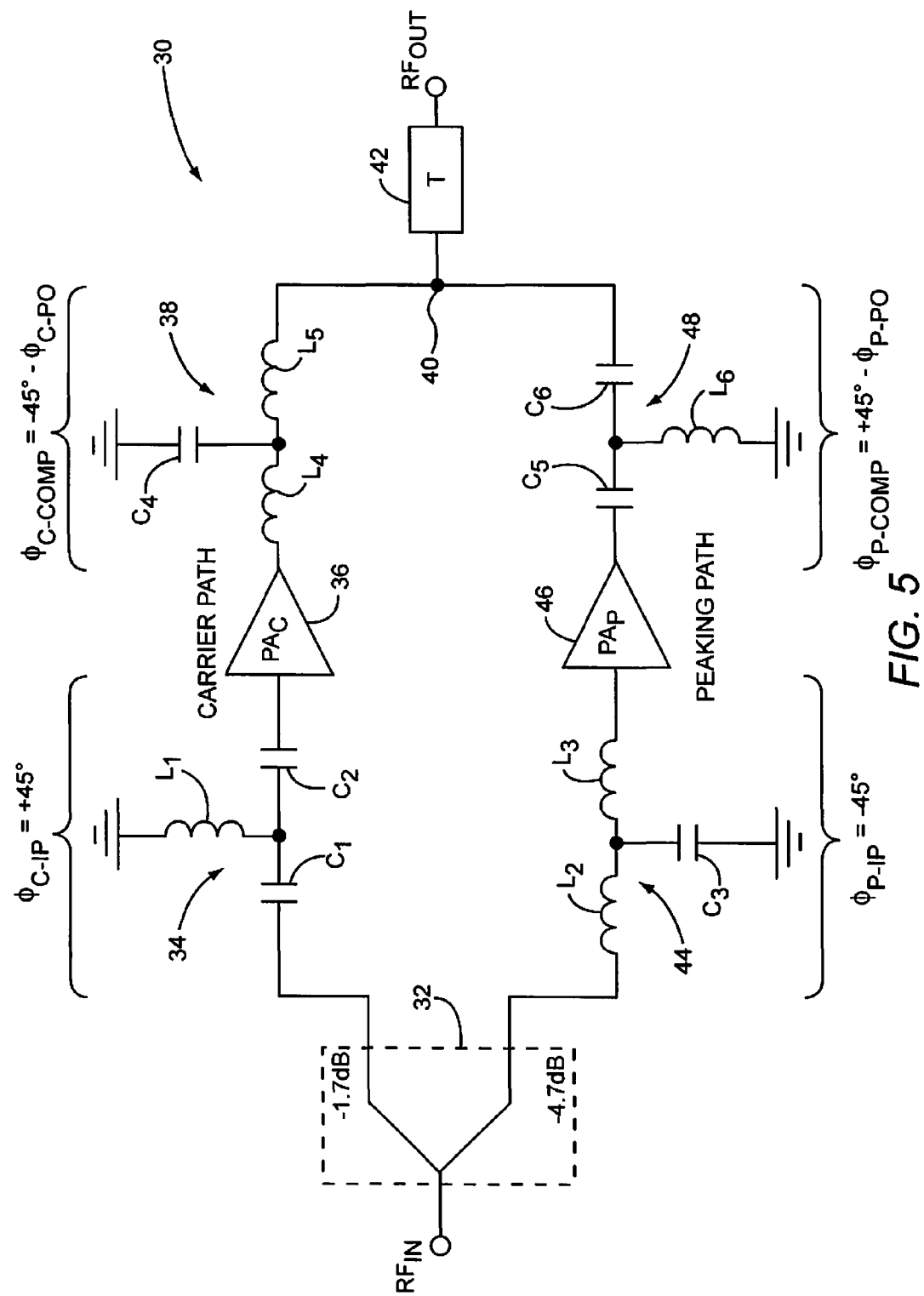
FIG. 5 is schematic diagram of an enhanced Doherty amplifier, according to one embodiment of the disclosure.

An example of an enhanced Doherty amplifier 30 is illustrated in FIG. 5. In particular, a modulated RF input signal $RF_{IN}$ is fed to a power splitter 32, such as a Wilkinson splitter, which splits the RF input signal $RF_{IN}$ along the carrier path and the peaking path. In this example, the RF input signal $RF_{IN}$ is unevenly split such that the carrier path receives the input power of the RF input signal $RF_{IN}$ attenuated by 1.7 dB and the peaking path receives the input power of the RF input signal $RF_{IN}$ attenuated by 4.7 dB. An uneven split in this manner further increases the efficiency of the enhanced Doherty amplifier 30 relative to an even split wherein with an even split, the RF input signal $RF_{IN}$ is split evenly (−3 dB) between the carrier and peaking paths.

The carrier path includes a carrier input network 34, carrier power amplifier circuitry ($PA_C$) 36, and a carrier output network 38. The carrier path terminates at a Doherty combining node 40, which is further coupled to a transformer 42, which is ultimately coupled to an antenna (not shown). The peaking path includes a peaking input network 44, peaking power amplifier circuitry ($PA_C$) 46, and a peaking output network 48. The peaking path terminates at the Doherty combining node 40.

In this example, the split RF input signals $RF_{IN}$ that are provided by the power splitter 32 are presented to the carrier and peaking input networks 34, 44 substantially in phase. In other words, the power splitter does not impart a 90° phase shift to the RF input signal $RF_{IN}$ that is provided to the peaking path in this embodiment. However, the RF input signals $RF_{IN}$ that are provided to the respective inputs of the carrier and peaking power amplifier circuitries 36, 46 need to by shifted by approximately 90°. Generally, the RF input signal $RF_{IN}$ that is presented to the input of the peaking power amplifier circuitry 46 lags the RF input signal $RF_{IN}$ that is presented to the input of the carrier power amplifier circuitry 36 by approximately 90°.

In one embodiment, the carrier and peaking input networks 34, 44 are lumped element networks that are designed to ensure that the RF input signal $RF_{IN}$ that is presented to the input of the peaking power amplifier circuitry 46 lags the RF input signal $RF_{IN}$ that is presented to the input of the carrier power amplifier circuitry 36 by approximately 90°. A lumped element network is one that includes inductors, capacitors, and resistors as the primary filtering and phase shifting components. In the illustrated embodiment, the carrier input network 34 advances the RF input signal $RF_{IN}$ in the carrier path by 45° (+45°), and the peaking input network 44 delays the RF input signal $RF_{IN}$ in the peaking path by 45° (−45°). By advancing the RF input signal $RF_{IN}$ in the carrier path by 45° and delaying the RF input signal $RF_{IN}$ in the peaking path by 45° (−45°), the RF input signal $RF_{IN}$ that is presented to the input of the peaking power amplifier circuitry 46 lags the RF input signal $RF_{IN}$ that is presented to the input of the carrier power amplifier circuitry 36 by approximately 90°.

While phase shifts of +45° and −45° in the respective carrier and peaking input networks 34, 44, are described, other combinations of phase shifts are possible. For example, phase shifts of +60° and −30° or −50° and +40° in the respective carrier and peaking input networks 34, 44 may be employed.

The carrier input network 34 of FIG. 5 is shown to include a series capacitor $C_1$, a shunt inductor $L_1$, and a series capacitor $C_2$. The peaking input network 44 is shown to include a series inductor $L_2$, a shunt capacitor $C_3$, and a series inductor $L_3$. As will be appreciated by one skilled in the art, these networks are merely exemplary and may be implemented in higher order (second and third order) networks of various configurations.

Continuing with FIG. 5, the carrier output network 38 is coupled between the carrier power amplifier circuitry 36 and the Doherty combining node 40. Similarly, the peaking output network 48 is coupled between the peaking power amplifier circuitry 46 and the Doherty combining node 40. The primary functions of the carrier and peaking output networks 38, 48 are to remove the phase shifts provided by the carrier and peaking input networks 34, 44 and provide any phase offsets deemed necessary to achieve desired performance metrics. After passing through the carrier and peaking output networks 38, 48, the amplified RF input signals $RF_{IN}$ from the carrier and peaking paths are presented to the Doherty combining node 40 in a phase alignment that allows the signals to be efficiently combined and stepped up or down by the transformer 42. After amplification, the RF input signal $RF_{IN}$ presented to the peaking output network 48 lags the RF input signal $RF_{IN}$ presented to the carrier output network 38 by approximately 90°. In the illustrated embodiment, the carrier output network 38 effectively shifts the RF input signal $RF_{IN}$ in the carrier path by a compensated carrier phase shift $\phi_{C\text{-}COMP}$.

The compensated carrier phase shift $\phi_{C\text{-}COMP}$ is the negative of the phase shift provided by the carrier input network 34 ($\phi_{C\text{-}IP}$) minus a carrier phase offset $\phi_{C\text{-}PO}$, wherein $\phi_{C\text{-}COMP} = \phi_{C\text{-}IP} - \phi_{C\text{-}PO}$. In this example, the phase shift provided by the carrier input network 34 ($\phi_{C\text{-}IP}$) is +45°. The carrier phase offset $\phi_{C\text{-}PO}$ corresponds to the reactive component of the impedance presented to the output of the carrier power amplifier circuitry 36 at the intended operating frequency range or ranges. This impedance is effectively the composite impedance provided by the carrier output network 38, the peaking path, and the transformer 42 at the intended operating frequency range or ranges. The goal is to have a substantially real impedance (pure resistive) presented to the output of the carrier power amplifier circuitry 36 at the intended operating frequency range or ranges.

Similarly, the peaking output network 48 effectively shifts the RF input signal $RF_{IN}$ in the peaking path by a compensated peaking phase shift $\phi_{P\text{-}COMP}$. The compensated peaking phase shift $\phi_{P\text{-}COMP}$ is the negative of the phase shift provided by the peaking input network 44 ($\phi_{P\text{-}IP}$) minus a peaking phase offset $\phi_{P\text{-}PO}$, wherein $\phi_{P\text{-}COMP} = -\phi_{P\text{-}IP} - \phi_{P\text{-}PO}$. In this example, the phase shift provided by the peaking input network 44 ($\phi_{P\text{-}IP}$) is −45°. The peaking phase offset $\phi_{P\text{-}PO}$ corresponds to the reactive component of the impedance presented to the output of the peaking power amplifier circuitry 46 at the intended operating frequency range or ranges. This impedance is effectively the composite impedance provided by the peaking output network 48, the carrier path, and the transformer 42 at the intended operating frequency range or ranges. The goal is to have a substantially real impedance (pure resistive) presented to the output of the peaking power amplifier circuitry 46 at the intended operating frequency range or ranges. While baseline phase shifts of +45° ($\phi_{C\text{-}IP}$) and −45° ($\phi_{P\text{-}IP}$) in the respective carrier and peaking output networks 38, 48, are described, these phase shifts merely mirror those provided in the respective carrier and peaking input networks 34, 44. As noted above, other combinations of phase shifts are possible.

In FIG. 5, the carrier output network 38 is shown to include a series inductor $L_4$, a shunt capacitor $C_4$, and a series inductor $L_5$. The peaking output network 48 is shown to include a series capacitor $C_5$, a shunt inductor 4, and a series capacitor $C_6$. As will be appreciated by one skilled in the art, these networks are merely exemplary and may be implemented in higher order networks of various configurations.

In the illustrated embodiment, the carrier power amplifier circuitry 36 provides a class A/B (or B) amplifier, and the peaking power amplifier circuitry 46 provides a class C amplifier. Each of these amplifiers is generally formed from one or more transistors. In select embodiments, the amplifiers are formed from one of Gallium Nitride (GaN) high electron mobility transistors (HEMTs), Gallium Arsenide (GaAs) or Silicon Carbide (SiC) metal semiconductor field effect transistor (MESFETS), and laterally diffused metal oxide semiconductor (LDMOS) transistors. However, those skilled in the art will recognize other applicable transistors and material systems are applicable.

During operation of the enhanced Doherty amplifier 30, the RF input signal $RF_{IN}$ is split by the power splitter 32 and directed along the carrier and peaking paths to the respective carrier and peaking power amplifier circuitries 36 and 46. The RF input signal $RF_{IN}$ is advanced 45° in the carrier path by the carrier input network 34 before being presented to the carrier power amplifier circuitry 36. The RF input signal $RF_{IN}$ is delayed 45° in the peaking path by the peaking input network 48 before being presented to the peaking power amplifier circuitry 46.

As noted above, Doherty amplifiers characteristically operate in two regions. In the first region R1, only the carrier power amplifier circuitry 36 is turned on and operates to amplify the RF input signal $RF_{IN}$. In the second region R2, both the carrier power amplifier circuitry 36 and the peaking power amplifier circuitry 46 operate to amplify the RF input signal $RF_{IN}$ in the respective carrier and peaking paths. The threshold between the two regions corresponds to a magnitude of RF input signal $RF_{IN}$ in the carrier path where the carrier power amplifier circuitry 36 becomes saturated. In the first region R1, the levels of the RF input signal $RF_{IN}$ are below the threshold. In the second region R2, the levels of RF input signal $RF_{IN}$ are at or above the threshold In the first region R1 where the level of the RF input signal $RF_{IN}$ is below the given threshold, the carrier power amplifier circuitry 36 amplifies the portion of the RF input signal $RF_{IN}$ in the carrier path. The amplified RF input signal $RF_{IN}$ is shifted by the compensated carrier phase shift $\phi_{C\text{-}COMP}$ by the carrier output network 38 and passed to the Doherty combining node 40. Notably, effectively no signal is provided to the Doherty combing 40 node via the peaking path in the first region R1 when the RF input signal $RF_{IN}$ is below the given threshold. In the first region R1, the peaking power amplifier circuitry 46 is turned off and the overall efficiency of the enhanced Doherty amplifier 30 is determined predominantly by the efficiency of the carrier power amplifier circuitry 36.

In the second region R2 where the RF input signal $RF_{IN}$ is at or above the given threshold, the carrier power amplifier circuitry 36 is saturated and delivers its maximum power to the Doherty combining node 40 via the carrier output network 38. Again, the amplified RF input signal $RF_{IN}$ is shifted by the compensated carrier phase shift $\phi_{C\text{-}COMP}$ by the carrier output network 38 and passed to the Doherty combining node 40.

Further, as the RF input signal $RF_{IN}$ rises above the given threshold, the peaking power amplifier circuitry 46 turns on and begins amplifying the portion of the RF input signal $RF_{IN}$ that flows along the peaking path. As the RF input signal $RF_{IN}$ continues to rise above the given threshold, the peaking power amplifier circuitry 46 delivers more power to the Doherty combining node 40 via the peaking output network 48 until the peaking power amplifier circuitry 46 becomes saturated. Notably, the peaking output network 48 effectively shifts the RF input signal $RF_{IN}$ in the peaking path by the compensated peaking phase shift $\phi_{P\text{-}COMP}$. Accordingly, the RF input signals $RF_{IN}$ arrive at the Doherty combining node 40 from the respective carrier and peaking paths, are reactively combined at the Doherty combining node 40, and are then stepped up or down via the transformer 42 to generate the RF output signal $RF_{OUT}$.

In comparison with the conventional Doherty amplifier 10 (FIG. 1), the enhanced Doherty amplifier 30 (FIG. 5) has effectively replaced the transmission lines 16, 20, 26, 28 with the input and output networks 34, 44, 38, 48 in both the carrier and peaking paths. Employing lumped element-based input and output networks 34, 44, 38, 48 in the carrier and peaking paths allows the enhanced Doherty amplifier 30 to be viewed and synthesized as a band-pass filter. As such, the respective networks as well as the power splitter 32 and transformer 42 may be synthesized as part of the enhanced Doherty amplifier 30 to achieve desired performance characteristics in much the same fashion as a band-pass filter can be synthesized. The performance characteristics of primary interest in the enhanced Doherty amplifier 30 include bandwidth, terminal impedances, power gain, and output power.

While the input and output networks 34, 44, 38, 48 may be synthesized to emulate the amplitude and phase responses of the transmission lines 16, 20, 26, 28, doing so would limit the performance of the enhanced Doherty amplifier 30 to that of the conventional Doherty amplifier 10. For enhanced performance, the order and configuration of the input and output networks 34, 44, 38, 48 may be synthesized to better optimize the phase differences between the carrier and peaking paths as well as provide improved input and output matching to achieve desired performance characteristics at maximum and backed-off power levels. Notably, the effective bandwidth of the enhanced Doherty amplifier 30 can be dramatically increased over what has been achieved by the conventional Doherty amplifier 10 while maintaining high efficiency at maximum and backed-off power levels.

This increase in bandwidth can be used to allow a single enhanced Doherty amplifier 30 to cover multiple communication bands that operate in disparate frequency bands, increase the available bandwidth for a given communication band to support higher data rates and additional channels, or a combination thereof. As noted above, the conventional Doherty amplifier 10 is relatively bandwidth limited and only provides an available instantaneous bandwidth of 5% of the operating frequency. For example, UMTS is allocated the frequency band of 2.11 and 2.17 GHz and requires a minimum bandwidth of 60 MHz. Since the conventional Doherty amplifier 10 can support a bandwidth of 105 MHz, it can handle the UMTS band. However, if there is a need to handle the UMTS band between 2.11 and 2.17 GHz as well as LTE band between 2.6 and 2.7 with the same amplifier circuitry, a bandwidth of essentially 600 MHz is required, and clearly, the conventional Doherty amplifier 10 is unable to meet such bandwidth requirements. The enhanced Doherty amplifier 30 can be designed to meet these requirements while achieving desirable efficiency, gain, and output power requirements.

Figures 6A, 7A:
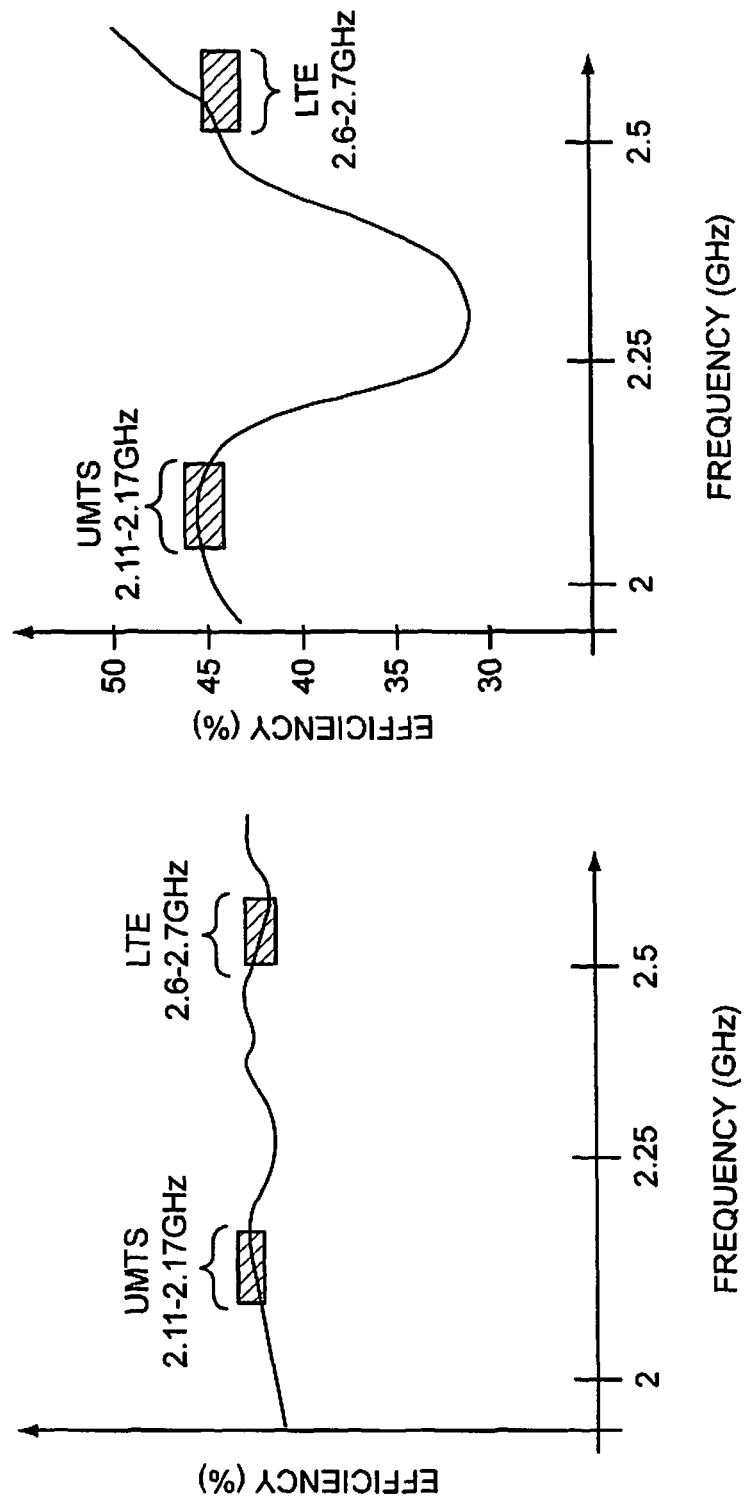
FIG. 6A is a plot of efficiency versus frequency for a first configuration of the enhanced Doherty amplifier of FIG. 5.
FIG. 7A is a plot of efficiency versus frequency for a second configuration of the enhanced Doherty amplifier of FIG. 5.
Figure 6B:
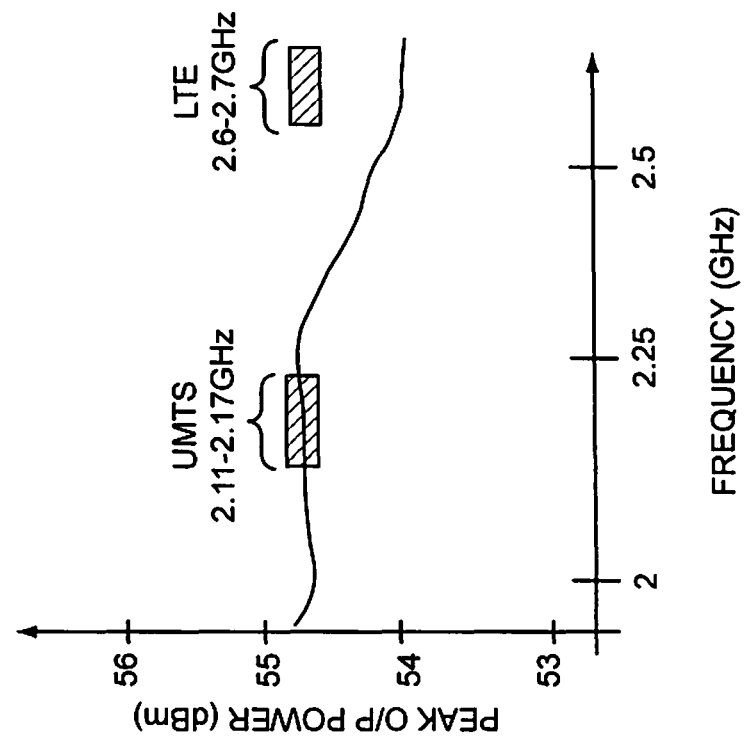
FIG. 6B is a plot of peak output power versus frequency for the first configuration of the enhanced Doherty amplifier of FIG. 5.

The following provides two of many examples where the enhanced Doherty amplifier 30 can be configured to handle both the UMTS and LTE bands, which reside in the 2.11 to 2.17 GHz and 2.6 to 2.7 GHz bands. For the first example, the enhanced Doherty amplifier 30 is synthesized to provide relatively uniform gain and backed-off power efficiency throughout a 600 MHz band between 2.11 and 2.7 GHz to cover both the UMTS and LTE bands. As illustrated in FIG. 6A, which is a plot of efficiency versus frequency at a 6 dB backed-off power level, the enhanced Doherty amplifier 30 can be synthesized to provide relatively uniform efficiency throughout the 2.11 to 2.7 GHz frequency range at backed-off power levels. However, since the ultimate bandwidth potential for an amplifier design depends on the competing characteristics of efficiency, gain, and output power, compromises among these characteristics always come into play. In this example, the compromises result in a noticeable, but acceptable, drop in peak output power in the LTE band (2.6-2.7 GHz) relative to the peak output power in the UMTS band. The drop is illustrated in FIG. 6B, which plots peak output power versus frequency.

For the second example, again assume that there is a need to support both the UMTS and LTE bands; however, additional output power in the LTE band and higher efficiency is desired when operating in both the UMTS and LTE bands. Further, assume that the efficiency, gain, and output power between the UMTS and LTE bands is either unimportant or that there is a desire to intentionally reduce the gain between the UMTS and LTE bands (≅2.12 to 2.5 GHz). By properly synthesizing the input and output networks 34, 44, 38, 48 and potentially the power splitter 32 and transformer 42, a tailored response may be achieved. As illustrated in FIG. 7A, which is a plot of efficiency versus frequency at a 6 dB backed-off power level, the enhanced Doherty amplifier 30 can be synthesized to provide an efficiency response that is optimized for the UMTS and LTE bands. As such, efficiency peaks about the UMTS and LTE bands and dips significantly in the unused frequency band between the UMTS and LTE bands.

Figure 7B:
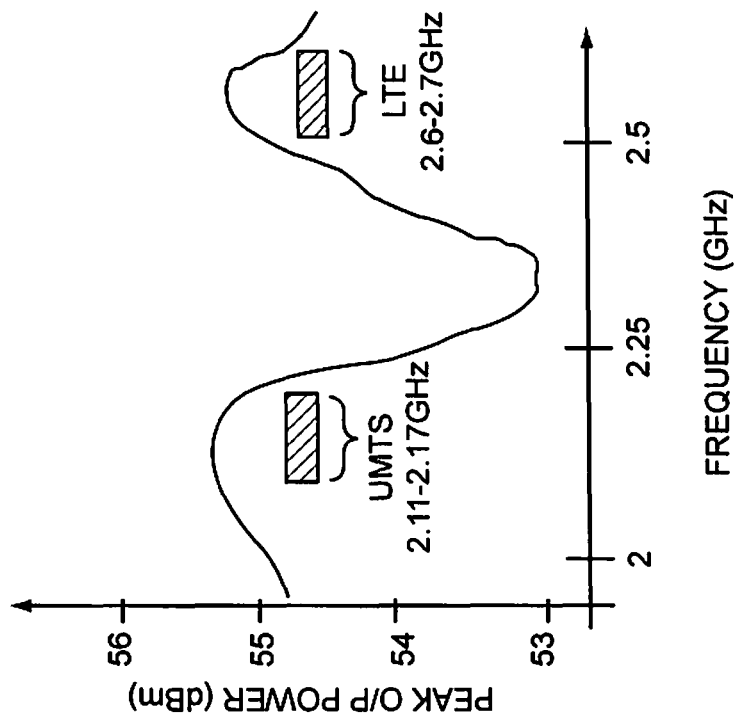
FIG. 7B is a plot of peak output power versus frequency for the second configuration of the enhanced Doherty amplifier of FIG. 5.

Similarly, the peak output power response as of function of frequency for the UMTS and LTE bands is also optimized, as illustrated in FIG. 7B. As with efficiency, the peak output powers in the UMTS and LTE bands are boosted relative to the first example (FIG. 6B) while a dip, or null, in the peak output power (and likely gain) is provided between the UMTS and LTE bands. The dip may also be tailored to help reduce noise or interference between the bands. In essence, the enhanced Doherty amplifier 30 can be tailored to trade uniform power and efficiency across a wide bandwidth for exceptional frequency and peak output power responses in select pass-bands that are separated by wide frequency range.

While UMTS and LTE bands are illustrated, other communication bands for the various standards may be addressed in similar fashion. For example, the first communication band could be one of a PCS band, a UMTS band, and a GSM band and the second communication band could be one of an LTE band and a WiMax band. Further, these concepts may be applied for different communication bands in the same standard. For example, one enhanced Doherty amplifier 30 could be used to support both the 2.5 and 3.5 GHz WiMax bands. Also, a given pass-band may be widened to support relatively adjacent communication bands, such as 1.8 GHz PCS and 2.1 GHz UMTS. While only two communication bands are illustrate in the second example, the enhanced Doherty amplifier 30 could be synthesized to support three or more bands in similar fashion wherein dips in backed-off power efficiency, gain, or output power may be provided if, and as, desired.

The input and output networks 34, 44, 38, 48 may also be synthesized to provide responses that have different efficiency, gain, or output power responses for different communication bands. For example, for communication bands that are separated by 200 MHz, 250 MHz, 300 MHz, 400 MHz, 500 MHz, 1 GHz or more, an enhanced Doherty amplifier 30 could support a lower band that is 150 MHz wide at a higher backed-off power efficiency and peak output power and a higher band that is 250 MHz wide at a slightly lower backed-off power efficiency and peak output power. In essence, the enhanced Doherty amplifier 30 allows for highly configurable responses while providing exceptional efficiency at backed-off and maximum power levels throughout wide frequency ranges as well as for disparate communication bands that are separated by large frequency ranges. Thus, a single power amplifier topology can be used to efficiency support multiple, disparate communication bands.

Figure 8:
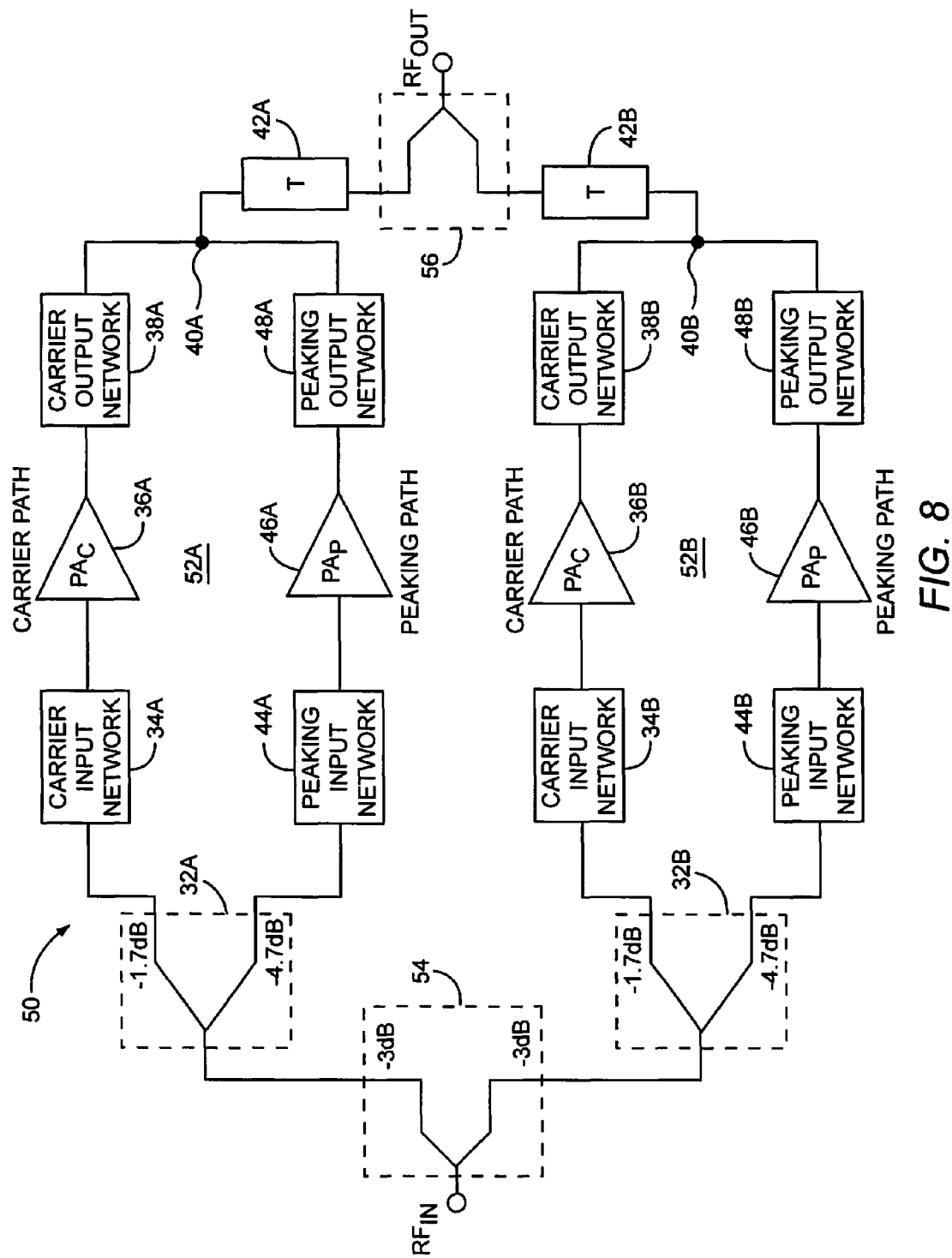
FIG. 8 is schematic diagram of an enhanced Doherty amplifier, according to another embodiment of the disclosure.

The enhanced Doherty amplifier 30 is modular, and as such, can be used in parallel with one or more other enhanced Doherty amplifiers 30 for higher power applications. An exemplary modular Doherty configuration 50 is illustrated in FIG. 8. With the modular Doherty configuration 50, the same benefits and configurability as described above apply. The modular Doherty configuration 50 includes two enhanced Doherty modules 52A, 52B, which correspond to the enhanced Doherty amplifier 30 of FIG. 5.

An RF input signal $RF_{IN}$ is fed to a power splitter 54, such as a Wilkinson splitter, which splits the RF input signal $RF_{IN}$ along two paths. The first path leads to the input of a power splitter 32A, and the second path lead to the input of a power splitter 32B. In this embodiment, the RF input signal $RF_{IN}$ is evenly split between the two paths such that each of the enhanced Doherty modules 52A, 52B receives the input power of the RF input signal $RF_{IN}$ attenuated by 3 dB via the respective power splitters 32A, 32B.

The power splitters 32A, 32B split the RF input signal $RF_{IN}$ along the respective carrier and peaking paths of the enhanced Doherty modules 52A, 52B. In this example, the RF input signal $RF_{IN}$ is unevenly split by the power splitters 32A, 32B, such that the carrier paths receive the input power of the RF input signal $RF_{IN}$ attenuated by another 1.7 dB and the peaking path receive the input power of the RF input signal $RF_{IN}$ attenuated by another 4.7 dB. As noted above, employing an uneven split in this manner further increases the efficiency of the enhanced Doherty amplifier relative to an even split.

The carrier paths of the respective enhanced Doherty modules 52A, 52B include carrier input networks 34A, 34B, carrier power amplifier circuitries ($PA_C$) 36A, 36B, and carrier output networks 38A, 38B. The carrier paths terminate at respective Doherty combining nodes 40A, 40B, which are further coupled to respective transformers 42A, 42B. The peaking paths include peaking input networks 44A, 44B, peaking power amplifier circuitries ($PA_P$) 46A, 46B, and peaking output networks 48A, 48B. The peaking paths terminate at the respective Doherty combining nodes 40A, 40B.

The split RF input signals $RF_{IN}$ that are provided by the power splitters 32A, 32B are presented to the carrier and peaking input networks 34A, 34B, 44A, 44B substantially in phase. In one embodiment, the carrier and peaking input networks 34A, 34B, 44A, 44B are lumped element networks that are designed to ensure that the RF input signals $RF_{IN}$ that are presented to the input of the peaking power amplifier circuitries 46A, 46B lag the RF input signals $RF_{IN}$ that are presented to the input of the carrier power amplifier circuitries 36A, 36B by approximately 90°. In the illustrated embodiment, the carrier input networks 34A, 34B advance the RF input signals $RF_{IN}$ in the carrier paths by 45° (+45°), and the peaking input networks 44A, 44B delay the RF input signals $RF_{IN}$ in the peaking paths by 45° (−45°). By advancing the RF input signals $RF_{IN}$ in the carrier path by 45° and delaying the RF input signals $RF_{IN}$ in the peaking paths by 45° (−45°), the RF input signals $RF_{IN}$ that are presented to the inputs of the peaking power amplifier circuitries 46A, 46B lag the RF input signals $RF_{IN}$ that are presented to the inputs of the carrier power amplifier circuitries 36A, 36B by approximately 90°. While phase shifts of +45° and −45° in the respective carrier and peaking input networks 34A, 34B, 44A, 44B, are described, other combinations of phase shifts are possible.

The carrier output networks 38A, 38B are coupled between the carrier power amplifier circuitries 36A, 36B and the respective Doherty combining nodes 40A, 40B. Similarly, the peaking output networks 48A, 48B are coupled between the peaking power amplifier circuitries 46A, 46B and the respective Doherty combining node 40A, 40B. The primary functions of the carrier and peaking output networks 38A, 38B, 48A, 48B are to remove the phase shifts provided by the carrier and peaking input networks 34A, 34B, 44A, 44B and provide any phase offsets deemed necessary to achieve desired performance metrics. After passing through the carrier and peaking output networks 38A, 38B, 48A, 48B, the amplified RF input signals $RF_{IN}$ from the carrier and peaking paths are presented to the respective Doherty combining nodes 40A, 40B in a phase alignment that allows the signals to be efficiently combined and stepped up or down by the respective transformers 42A, 42B.

After amplification, the RF input signals $RF_{IN}$ presented to the peaking output networks 48A, 48B lag the RF input signals $RF_{IN}$ presented to the carrier output networks 38A, 38B by approximately 90°. In the illustrated embodiment, the carrier output networks 38A, 38B effectively shift the RF input signals $RF_{IN}$ in the carrier path by a compensated carrier phase shift $\phi_{C\text{-}COMP}$. Similarly, the peaking output networks 48A, 48B effectively shift the RF input signal $RF_{IN}$ in the peaking path by the compensated peaking phase shift $\phi_{P\text{-}COMP}$. The carrier and peaking input networks 34A, 34B, 44A, 44B may be second, third, or higher order networks.

Once the signals from the respective carrier and peaking paths are combined at the Doherty combing nodes 40A, 40B and stepped up or down by the respective transformers 42A, 42B, the resultant signals from each of the enhanced Doherty modules 52A, 52B are combined via the coupler 56 to create the RF output signal $RF_{OUT}$.

Each of the Doherty modules 52A, 52B operates in two regions, as described above for the enhanced Doherty amplifier 30. In the first region, only the carrier power amplifier circuitries 36A, 36B are turned on and operate to amplify the RF input signal $RF_{IN}$. In the second region, the carrier power amplifier circuitries 36A, 36B and the peaking power amplifier circuitries 46A, 46B operate to amplify the RF input signal $RF_{IN}$ in the respective carrier and peaking paths. The threshold between the two regions corresponds to a magnitude of RF input signal $RF_{IN}$ in the carrier path where the carrier power amplifier circuitries 36A, 36B become saturated. In the first region, the levels of the RF input signal $RF_{IN}$ are below the threshold. In the second region, the levels of RF input signal $RF_{IN}$ are at or above the threshold As seen from above, the enhanced Doherty amplifiers (30, 50) of the present disclosure provide significant performance improvements over conventional Doherty amplifiers designs. Further, the configurability of the enhanced Doherty amplifiers (30, 50) allows support for multiple communication bands that fall in relatively disparate frequency ranges. These bandwidth improvements are due to the ability to better optimize impedance tracking between the carrier and peaking paths as well as improve the input and output matching relative to the amplifiers in the carrier and peaking paths. Further, the large signal input and output return losses, both at heavily backed-off and maximum power levels, can be significantly improved over conventional designs.

While innumerable performance configurations are possible, the following illustrates some exemplary configurations wherein the enhanced Doherty amplifier (30, 50) is configured to provide at any one of the aforementioned communication bands:

an instantaneous bandwidth of at least 15 percent and an efficiency of greater than 45 percent between 6 dB backed-off power and peak maximum output power when amplifying radio frequency signals in either of two different communication bands employing the same or different communication standards (i.e. when the communication bands are separated by 300 MHz);

an instantaneous bandwidth of at least 15 percent and an efficiency of greater than 40 percent between 6 dB backed-off power and peak maximum output power when amplifying radio frequency signals;

an instantaneous bandwidth of at least 20 percent and an efficiency of greater than 35 percent between 6 dB backed-off power and peak maximum output power r when amplifying radio frequency signals;

an instantaneous bandwidth of at least 20 percent and an efficiency of greater than 40 percent between 6 dB backed-off power and peak maximum output power when amplifying radio frequency signals; and an instantaneous bandwidth of at least 10 percent and an efficiency of greater than 45 percent between 6 dB backed-off power and peak maximum output power when amplifying radio frequency signals.

Those skilled in the art will recognize improvements and modifications to the embodiments of the present disclosure. All such improvements and modifications are considered within the scope of the concepts disclosed herein and the claims that follow.

What is claimed:

1. A Doherty amplifier comprising:
a carrier splitter output and a peaking splitter output;
a Doherty combining node;
a carrier path comprising:
 carrier power amplifier circuitry;
 a first plurality of carrier path lumped elements coupled between the carrier splitter output and the carrier power amplifier circuitry; and
 a second plurality of carrier path lumped elements coupled with the carrier power amplifier circuitry and the Doherty combining node; and
a peaking path comprising:
 power amplifier circuitry;
 a first plurality of peaking path lumped elements coupled between the peaking splitter output and the peaking power amplifier circuitry; and
 a second plurality of peaking path lumped elements coupled with the peaking power amplifier circuitry and the Doherty combining node, wherein the first and second plurality of carrier path lumped elements and the first and second plurality of peaking path lumped elements are configured such that a frequency response of the Doherty amplifier provides a first pass-band for a first communication band in a first frequency range and a second pass-band for a second communication band in a second frequency range, which is separate from the first pass-band, wherein the first plurality of carrier path lumped elements is configured to advance a phase of a carrier signal split from an input signal provided at the carrier splitter output and the first plurality of peaking path lumped elements is configured to delay a phase of a peaking signal split from the input signal provided at the peaking splitter output thereby causing the peaking signal to lag the carrier signal by approximately 90 degrees when the carrier and peaking signals are respectively presented to the carrier and peaking power amplifier circuitries.

2. The Doherty amplifier of claim 1, wherein the plurality of carrier path and peaking path lumped elements are configured to provide wideband functionality to the Doherty amplifier.

3. The Doherty amplifier of claim 2 wherein the Doherty amplifier covers communication bands operating in a frequency band between about 0.9 GHz to about 2.7 GHz.

4. The Doherty amplifier of claim 2 wherein each of the plurality of carrier path and peaking path lumped elements does not comprise a transmission line.

5. The Doherty amplifier of claim 1, wherein the plurality of carrier path and peaking path lumped elements are configured to provide multiband functionality to the Doherty amplifier.

6. The Doherty amplifier of claim 1 wherein each of the plurality of carrier path and peaking path lumped elements are synthesized as a group to provide a desired performance characteristic.

7. The Doherty amplifier of claim 1 and the second plurality of carrier path and peaking path lumped elements are configured to respectively impose compensated carrier and peaking phase offsets causing the peaking and carrier signals to arrive at the Doherty combining node for reactive combining to generate an output signal.

8. The Doherty amplifier of claim 7 wherein the respective compensated carrier and peaking phase offsets effectively reverse the approximately 90 degree phase shift provided by the first plurality of carrier path and peaking path lumped elements as well as remove carrier and peaking phase offsets, the carrier phase offset substantially corresponding to a reactive component of an impedance presented to an output of the carrier power amplifier circuitry at an intended operating frequency range or ranges and the peaking phase offset substantially corresponding to a reactive component of an impedance presented to an output of the peaking power amplifier circuitry at the intended operating frequency range or ranges.

9. The Doherty amplifier of claim 8 wherein the impedance presented to the output of the carrier power amplifier circuitry is effectively a composite impedance provided by the second plurality of carrier path lumped elements, the peaking path, and a transformer coupled to the Doherty combining node at the intended operating frequency range or ranges and the impedance presented to the output of the peaking amplifier circuitry is effectively a composite impedance provided by the second plurality of peaking path lumped elements, the carrier path, and the transformer coupled to the Doherty combining node at the intended operating frequency range or ranges.

10. The Doherty amplifier of claim 1 wherein the first plurality of carrier path lumped elements advances a phase of the carrier signal by approximately 45 degrees and the first plurality of peaking path lumped elements delays a phase of the peaking signal by approximately 45 degrees such that the phase of the peaking signal lags the phase of the carrier signal by approximately 90 degrees when the carrier and peaking signals are respectively presented to the carrier and peaking power amplifier circuitries.

11. The Doherty amplifier of claim 10 wherein the compensated carrier and peaking phase offsets effectively reverse the approximately 90 degree phase shift provided by the first plurality of carrier path and peaking path lumped elements as well as remove the respective compensated carrier and peaking phase offsets, the carrier phase offset substantially corresponding to a reactive component of an impedance presented to an output of the carrier power amplifier circuitry at an intended operating frequency range or ranges and the peaking phase offset substantially corresponding to a reactive component of an impedance presented to an output of the peaking power amplifier circuitry at the intended operating frequency range or ranges.

12. The Doherty amplifier of claim 1 wherein an instantaneous bandwidth of at least 15 percent and an efficiency of greater than 40 percent between 6 dB backed-off power and peak maximum output power are provided by the enhanced Doherty amplifier when amplifying radio frequency signals.

13. The Doherty amplifier of claim 1 wherein the first and second plurality of carrier path and peaking path lumped elements include capacitive elements and inductive elements.

14. The Doherty amplifier of claim 1, wherein each of the carrier amplifier circuitries include gallium nitride.

15. A multiband Doherty amplifier comprising:
a carrier splitter output and a peaking splitter output;
a Doherty combining node;
a carrier path comprising:
carrier power amplifier circuitry;
a first plurality of carrier path lumped elements coupled between the carrier splitter output and the carrier power amplifier circuitry; and
a second plurality of carrier path lumped elements coupled with the carrier power amplifier circuitry and the Doherty combining node; and
a peaking path comprising:
power amplifier circuitry;
a first plurality of peaking path lumped elements coupled between the peaking splitter output and the peaking power amplifier circuitry; and
a second plurality of peaking path lumped elements coupled with the peaking power amplifier circuitry and the Doherty combining node;
wherein each of the plurality of carrier path and peaking path lumped elements are configured to provide multiband functionality to the multiband Doherty amplifier and the first plurality of carrier path lumped elements is configured to advance a phase of the carrier signal and the first plurality of peaking path lumped elements is configured to delay a phase of the peaking signal thereby causing the peaking signal to lag the carrier signal by approximately 90 degrees when the carrier and peaking signals are respectively presented to the carrier.

16. The multiband Doherty amplifier of claim 15 wherein each of the plurality of carrier path and peaking path lumped elements does not comprise a transmission line.

17. The multiband Doherty amplifier of claim 15 wherein each of the plurality of carrier path and peaking path lumped elements are synthesized as a group to provide a desired performance characteristic.

18. The multiband Doherty amplifier of claim 15 and peaking power amplifier circuitries and the second plurality of carrier path and peaking path lumped elements are configured to respectively impose compensated carrier and peaking phase offsets causing the peaking and carrier signals to arrive at the Doherty combining node for reactive combining to generate an output signal.

19. The multiband Doherty amplifier of claim 18 wherein the respective compensated carrier and peaking phase offsets effectively reverse the approximately 90 degree phase shift provided by the first plurality of carrier path and peaking path lumped elements as well as remove carrier and peaking phase offsets, the carrier phase offset substantially corresponding to a reactive component of an impedance presented to an output of the carrier power amplifier circuitry at an intended operating frequency range or ranges and the peaking phase offset substantially corresponding to a reactive component of an impedance presented to an output of the peaking power amplifier circuitry at the intended operating frequency range or ranges.

20. The multiband Doherty amplifier of claim 19 wherein the impedance presented to the output of the carrier power amplifier circuitry is effectively a composite impedance provided by the second plurality of carrier path lumped elements, the peaking path, and a transformer coupled to the Doherty combining node at the intended operating frequency range or ranges and the impedance presented to the output of the peaking amplifier circuitry is effectively a composite impedance provided by the second plurality of peaking path lumped elements, the carrier path, and the transformer coupled to the Doherty combining node at the intended operating frequency range or ranges.

21. The multiband Doherty amplifier of claim 15 wherein the first plurality of carrier path lumped elements advances a phase of the carrier signal by approximately 45 degrees and the first plurality of peaking path lumped elements delays a phase of the peaking signal by approximately 45 degrees such that the phase of the peaking signal lags the phase of the carrier signal by approximately 90 degrees when the carrier and peaking signals are respectively presented to the carrier and peaking power amplifier circuitries.

22. The multiband Doherty amplifier of claim 21 wherein the compensated carrier and peaking phase offsets effectively reverse the approximately 90 degree phase shift provided by the first plurality of carrier path and peaking path lumped elements as well as remove the respective compensated carrier and peaking phase offsets, the carrier phase offset substantially corresponding to a reactive component of an impedance presented to an output of the carrier power amplifier circuitry at an intended operating frequency range or ranges and the peaking phase offset substantially corresponding to a reactive component of an impedance presented to an output of the peaking power amplifier circuitry at the intended operating frequency range or ranges.

23. The multiband Doherty amplifier of claim 15 wherein the first and second plurality of carrier path lumped elements and the first and second plurality of peaking path lumped elements are configured such that a frequency response of the enhanced Doherty amplifier provides a first pass-band for a first communication band in a first frequency range and a second pass-band for a second communication band in a second frequency range, which is separate from the first pass-band.

24. The multiband Doherty amplifier of claim 23 wherein an instantaneous bandwidth of at least 15 percent and an efficiency of greater than 45 percent between 6 dB backed-off power and peak maximum output power is provided by the enhanced Doherty amplifier when amplifying radio frequency signals in both the first and second communication bands.

25. The multiband Doherty amplifier of claim 15 wherein an instantaneous bandwidth of at least 15 percent and an efficiency of greater than 40 percent between 6 dB backed-off power and peak maximum output power are provided by the enhanced Doherty amplifier when amplifying radio frequency signals.

26. The multiband Doherty amplifier of claim 15 wherein the first and second plurality of carrier path and peaking path lumped elements include capacitive elements and inductive elements.

27. The multiband Doherty amplifier of claim 15, wherein each of the carrier amplifier circuitries include gallium nitride.

28. The multiband Doherty amplifier of claim 15 wherein the first and second plurality of carrier path lumped elements and the first and second plurality of peaking path lumped elements are configured such that a frequency response of the of the multiband Doherty amplifier provides a first pass-band for a first communication band in a first frequency range and a second pass-band for a second communication band in a second frequency range, which is separate from the first pass-band.

29. The enhanced Doherty amplifier of claim 28 wherein the frequency response provides a dip between the first and second pass-bands.

30. An enhanced Doherty amplifier comprising:
  a plurality of enhanced Doherty modules wherein each of the enhanced Doherty modules is configured to receive an input signal and provide an output signal;
  a splitter output configured to supply the input signal to each of the plurality of enhanced Doherty modules
  a combiner configured to combine each output signal received from the plurality of enhanced Doherty modules;
  wherein each of the enhanced Doherty modules comprises:
    a carrier splitter output and a peaking splitter output;
    a Doherty combining node;
    a carrier path comprising a carrier power amplifier circuitry, a carrier input network that includes a first plurality of carrier path lumped elements, the carrier input network being coupled between the carrier splitter output and the carrier power amplifier circuitry, and a carrier output network that includes a second plurality of carrier path lumped elements, the carrier output network being coupled between the carrier power amplifier circuitry and the Doherty combining node; and
    a peaking path comprising peaking power amplifier circuitry, a peaking input network that includes a first plurality of peaking path lumped elements, the peaking input network being coupled between the peaking splitter output and the peaking power amplifier circuitry, and a peaking output network that includes a second plurality of peaking path lumped elements, the peaking output network being coupled between the peaking power amplifier circuitry and the Doherty combining node,
    wherein the first plurality of carrier path lumped elements is configured to advance a phase of a carrier signal split from the input signal and provided at the carrier splitter output and the first plurality of peaking path lumped elements is configured to delay a phase of a peaking signal split from the input signal and provided at the peaking splitter output thereby causing the peaking signal to lag the carrier signal by approximately 90 degrees when the carrier and peaking signals are respectively presented to the carrier and peaking power amplifier circuitries and the second plurality of carrier path and peaking path lumped elements are configured to respectively impose compensated carrier and peaking phase offsets causing the peaking and carrier signals to arrive at the Doherty combining node for reactive combining to generate an output signal.

\* \* \* \* \*